US011935983B2

(12) United States Patent
Bieneman et al.

(10) Patent No.: US 11,935,983 B2
(45) Date of Patent: Mar. 19, 2024

(54) PORTABLE RAPID LARGE AREA THIN FILM PHOTOSINTERER

(71) Applicant: Google LLC, Mountain View, CA (US)

(72) Inventors: Aleksey Bieneman, Rensselaer, NY (US); Katy Kasmai, New York, NY (US); Haydn Kirk Vestal, Brooklyn, NY (US)

(73) Assignee: Google LLC, Mountain View, CA (US)

(*) Notice: Subject to any disclaimer, the term of this patent is extended or adjusted under 35 U.S.C. 154(b) by 559 days.

(21) Appl. No.: 16/664,262

(22) Filed: Oct. 25, 2019

(65) Prior Publication Data

US 2020/0329566 A1  Oct. 15, 2020

Related U.S. Application Data

(63) Continuation of application No. PCT/US2019/026752, filed on Apr. 10, 2019.

(51) Int. Cl.
*B22F 10/80* (2021.01)
*B22F 3/10* (2006.01)
(Continued)

(52) U.S. Cl.
CPC ............... *H01L 31/18* (2013.01); *B22F 3/10* (2013.01); *B22F 10/80* (2021.01); *B22F 10/85* (2021.01);
(Continued)

(58) Field of Classification Search
CPC .. H01L 31/18; B22F 3/10; B22F 10/80; B22F 10/85; B22F 10/31; B22F 10/36
See application file for complete search history.

(56) References Cited

U.S. PATENT DOCUMENTS

| 2007/0239142 A1 | 10/2007 | Altshuler et al. |
| 2008/0058783 A1 | 3/2008 | Altshuler et al. |

(Continued)

FOREIGN PATENT DOCUMENTS

| CN | 104735361 | 6/2015 |
| CN | 204991741 | 1/2016 |

(Continued)

OTHER PUBLICATIONS ndt.net [online] "Portable, Low-Cost Thermographic NDT System," e-Journal of Nondestrictive Testing (NDT) ISSN 1435-4934 (NDT.net Journal) NDT.net Issue: Feb. 2011, Available on or before Janaury 25, 2019 [Retrieved from Internet Jan. 16, 2020] Retrieved from Internet URL<https://www.ndt.net/search/docs.php3?id=10352> 3 pages.

(Continued)

*Primary Examiner* — Anthony M Liang
*Assistant Examiner* — Jacob J Gusewelle
(74) *Attorney, Agent, or Firm* — Fish & Richardson P.C.

(57) ABSTRACT

Methods and systems for using a photosintering system to sinter one or more paint layers for a paint circuit. In one aspect, a photosintering system includes a photosintering device including a light source and multiple proximity sensors, a data communication link, and one or more processors in data communication with the photosintering device over the data communication link, and is operable to perform the operations of obtaining an image of a sintering area, generating a grid of the sintering area including multiple sub-areas, and for each sub-area of the multiple sub-areas: determine a respective fractional sintering energy for the sub-area, indicate how to position a photosintering device relative to the sub-area, obtain current positional information for the photo sintering device, determining that the current positional, determine an exposure sintering (Continued)

energy for the particular sub-area, and trigger exposure of the exposure sintering energy to the particular sub-area.

7 Claims, 5 Drawing Sheets

(51) Int. Cl.
    *B22F 10/36*     (2021.01)
    *B22F 10/85*     (2021.01)
    *H01L 31/0216*     (2014.01)
    *H01L 31/18*     (2006.01)
    *H05K 3/12*     (2006.01)
    *B22F 10/31*     (2021.01)
    *C09D 11/52*     (2014.01)

(52) U.S. Cl.
    CPC ..... *H01L 31/02167* (2013.01); *H05K 3/1283* (2013.01); *B22F 10/31* (2021.01); *B22F 10/36* (2021.01); *C09D 11/52* (2013.01); *Y02P 10/25* (2015.11)

(56) References Cited

U.S. PATENT DOCUMENTS

| | | | |
|---|---|---|---|
| 2009/0136225 A1* | 5/2009 | Gai | G03B 15/05 396/180 |
| 2010/0315644 A1 | 12/2010 | Egan et al. | |
| 2011/0037002 A1 | 2/2011 | Johnson et al. | |
| 2015/0189761 A1 | 7/2015 | Chan et al. | |
| 2016/0248051 A1 | 8/2016 | Xu et al. | |

FOREIGN PATENT DOCUMENTS

| | | | | |
|---|---|---|---|---|
| JP | H09-266322 | 10/1997 | | |
| JP | 2009-059861 | 3/2009 | | |
| JP | 2013-183155 | 9/2013 | | |
| JP | 2013-232607 | 11/2013 | | |
| JP | 2016-060930 | 4/2016 | | |
| TW | 201338656 | 9/2013 | | |
| TW | 201338656 A | * | 9/2013 | ........... H05K 3/1283 |
| WO | WO 2007034161 | 3/2007 | | |
| WO | WO 2014/054350 | 4/2014 | | |
| WO | WO 2019055664 | 3/2019 | | |

OTHER PUBLICATIONS

PCT International Search Report and Written Opinion, issued in International Application No. PCT/US2019/026752, dated Dec. 12, 2019, 16 pages.

semco-tech.com [online] "Roll-to-roll Platform," Available on or before Dec. 6, 2018 [retrieved from internet Feb. 16, 2020] Retrieved from Internet: URL< http://semco-tech.com/roll-roll-platform> 1 page.

sugawara-labs.co [online]"High-intensity, Multi-function Portable Strobe: Mighty Strobe X-1" available on or before Jan. 3, 2019 [Retrieved from Internet:Jan. 16, 2020] Retrieved from Internet: URL<https://www.sugawara-labs.co.jp/en/xenonflashes/strobe/high_intensity_multi_function_portable_strobe> 3 pages.

wikipedia.org [online] "Furnace anneal" Last Updated: Dec. 22, 2019, [retrieved on Jan. 16, 2020] Retrieved from Internet: URL<https://en.wikipedia.org/wiki/Furnace_anneal> 1 page.

International Preliminary Report on Patentability in International Appln. No. PCT/US2019/026752, dated Sep. 28, 2021, 9 pages.

Office Action in Japanese Appln No. 2020-558454, dated Feb. 7, 2022, 6 pages (with English translation).

Office Action in Indian Appln. No. 202027041244, dated Jul. 22, 2022, 7 pages.

Office Action in Chinese Appln. No. 201980027336.8, dated Sep. 1, 2023, 19 pages (with English translation).

Office Action in Chinese Appln. No. 201980027336.8, dated Sep. 1, 2023, 8 pages.

\* cited by examiner

PORTABLE RAPID LARGE AREA THIN FILM PHOTOSINTERER

CROSS-REFERENCE TO RELATED APPLICATIONS

This application is a continuation application of, and claims priority to, PCT Patent Application No. PCT/US2019/026752, titled "PORTABLE RAPID LARGE AREA THIN FILM PHOTOSINTERER," filed on Apr. 10, 2019. The disclosure of the foregoing application is incorporated herein by reference in its entirety for all purposes.

BACKGROUND

Traditional solar cells use substrates with highly regular crystalline structure, for example, crystalline silicon. Newer technologies include thin-film, amorphous solar cells to create discrete layers of individual material with highly regular and predictable chemical structure. Commercial solar cell fabrication, in general, requires highly specialized equipment, which restricts fabricated solar cells to geographic locations with access to the complex manufacturing equipment and/or specialized shipping and installation capabilities.

SUMMARY

This specification relates to a photosintering system for sintering one or more paint layers for a paint circuit. The photosintering system includes a photosintering device that can be used to sinter an area including one or more paint layers, and where the operation of the photosintering device can be controlled using a mobile device (or another appropriate device, e.g., a tablet device or desktop device) that is in data communication with the photosintering device through a communication port (e.g., a serial port).

In general, one innovative aspect of the subject matter described in this specification can be embodied in methods including obtaining an image of a sintering area, generating, a grid of the sintering area including multiple sub-areas for the sintering area, each sub-area defined by a length and a width, and a respective position in the sintering area. For each particular sub-area of the multiple sub-areas the methods include: determining a respective fractional sintering energy for the particular sub-area, indicating how to position a photosintering device relative to the particular sub-area, obtaining current positional information for the photosintering device, determining that the current positional information indicates that the photosintering device is positioned relative to the particular sub-area in accordance with the indication of how to position the photosintering device, determining an exposure sintering energy for the particular sub-area and a cumulative amount of sintering energy previously exposed to the particular sub-area, and triggering exposure of the exposure sintering energy to the particular sub-area in accordance with the indication of how to position the photosintering device.

These and other embodiments can each optionally include one or more of the following features. In some implementations, obtaining the image of the sintering area includes capturing the image of the sintering area with a camera of a mobile device. The camera of the mobile device can be used to obtained current positional information by providing one or more images of the sintering area. The one or more images of the sintering area can include one or more images of one or more painted layers on a substrate.

In some implementations, the methods further include obtaining composition data for the sintering area, where the composition data includes one or more of i) a width and a length of the one or more painted layers, ii) layer thicknesses of the one or more painted layers, or iii) material compositions of the one or more painted layers.

In some implementations, the methods further include determining a total sintering energy for the sintering area based in part on the composition data for the sintering area, where the total sintering energy for the sintering area corresponds to an amount of energy required to sinter the one or more painted layers of the sintering area.

In some implementations, the methods further include obtaining composition data for each sub-area of the plurality of sub-areas, where the composition data for each sub-area includes one or more of i) a width and a length of one or more painted layers in the sub-area, ii) layer thicknesses of the one or more painted layers in the sub-area, or iii) material compositions of the one or more painted layers in the sub-area. A respective fractional sintering energy can be determined for each sub-area of the plurality of sub-areas based in part on composition data for the sub-area of the plurality of sub-areas.

In some implementations, determining that the current positional information indicates that the photosintering device is positioned relative to the particular sub-area in accordance with the indication of how to position the photosintering device includes determining, based on proximity data from one or more proximity sensors on the photosintering device, that the photosintering device is parallel with respect to the sub-area, e.g., parallel with respect to a surface of the sub-area.

An indication of how to position the photosintering device relative to the particular sub-area can include presenting positional information on a display of a mobile device, e.g., alignment cues in a graphical user interface on the mobile device. In some implementations, an indication of how to position the photosintering device relative to the particular sub-area can include transmitting instructions to an automated device, e.g., a control system in a factory setting, that controls a relative position of the photosintering device relative to the particular sub-area to alter an orientation of the photosintering device relative to the particular sub-area.

In general, one innovative aspect of the subject matter described in this specification can be embodied in a photosintering system including a photosintering device including a light source, e.g., a flash lamp, and multiple proximity sensors, a data communication link, and one or more processors in data communication with the photosintering device over the data communication link and operable to perform the methods of sintering a sintering area detailed above.

These and other embodiments can each optionally include one or more of the following features. The photosintering system can include a mobile device including a camera or an automated device that controls a relative position of the photosintering device relative to a particular sub-area of the sintering area, e.g., a control system in a factory setting. The camera of the mobile device can be used to capture one or more images of the sintering area to obtain, for example, an image of the sintering area, current positional information of the photosintering device relative to a particular sub-area of the sintering area, etc. The mobile device can be used, e.g., through a graphical user interface displayed on the mobile device, to provide an indication of how to position the photosintering device relative to the particular sub-area.

Particular embodiments of the subject matter described in this specification can be implemented to realize one or more of the following advantages. An advantage of this technology is that it includes a low-cost, portable photosintering system which can be used to sinter one or more layers of a solar paint circuit at an on-site location (e.g., at a private residence, in a factory setting, an office building, or the like). The photosintering system has a much lower capital expenditure when compared to conventional systems. The graphical user interface (GUI) of a photosintering application for the photosintering system can interactively guide users through a step-by-step process for painting and sintering a particular solar paint circuit, facilitating fabrication by a user with limited knowledge or experience with the manufacturing process. The photosintering application can be utilized cross-platform on various types of devices without requiring generation of platform-specific software. The photosintering system can further share a common control software implementation across multiple consumer-level/industrial-level platforms to allow for maximum development efficiency by ease of propagating improvements/updates amongst multiple different platforms. The photosintering system is adaptable to changes, for example, changes in number of photosintering devices, position/dimensions of the area to be sintered, and power of photosintering device(s), and can allow for easy simulation, due to the tensorflow format, in order to optimize production parameters, e.g., throughput yield.

Additionally, unlike traditional commercial solar cell fabrication, solar paint circuits can be fabricated with few tools (e.g., a hand mixer and an aerosolized sprayer) by individuals in any location (e.g., even in remote regions that do not have access to electricity or other resources required by conventional approaches). The solar paint circuits discussed herein are created using combinations of basic, inexpensive materials to form electronic circuits, which reduces fabrication complexity and reduces the cost to the manufacturer and end-user. In general, many of the materials used in the solar paint circuits are less hazardous and are less expensive to manufacture and ship than materials used in traditional solar cells. Moreover, existing infrastructure in commonly found paint factories can be converted easily to produce solar paint circuits, whereas traditional solar cell fabrication requires highly specialized equipment. The relationship between the electrically active material and its paint substrate enable the electrical properties of the paint to be selected using relatively simple mathematical analyses. Furthermore, the ability to control the viscosity of the paint and/or the number of layers applied enables the electrical characteristics to be easily changed by changing the viscosity and/or the number of layers of paint applied. This type of flexibility is typically unavailable with more conventional, high-precision circuit fabrication methods.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

Overview

Figure 1:
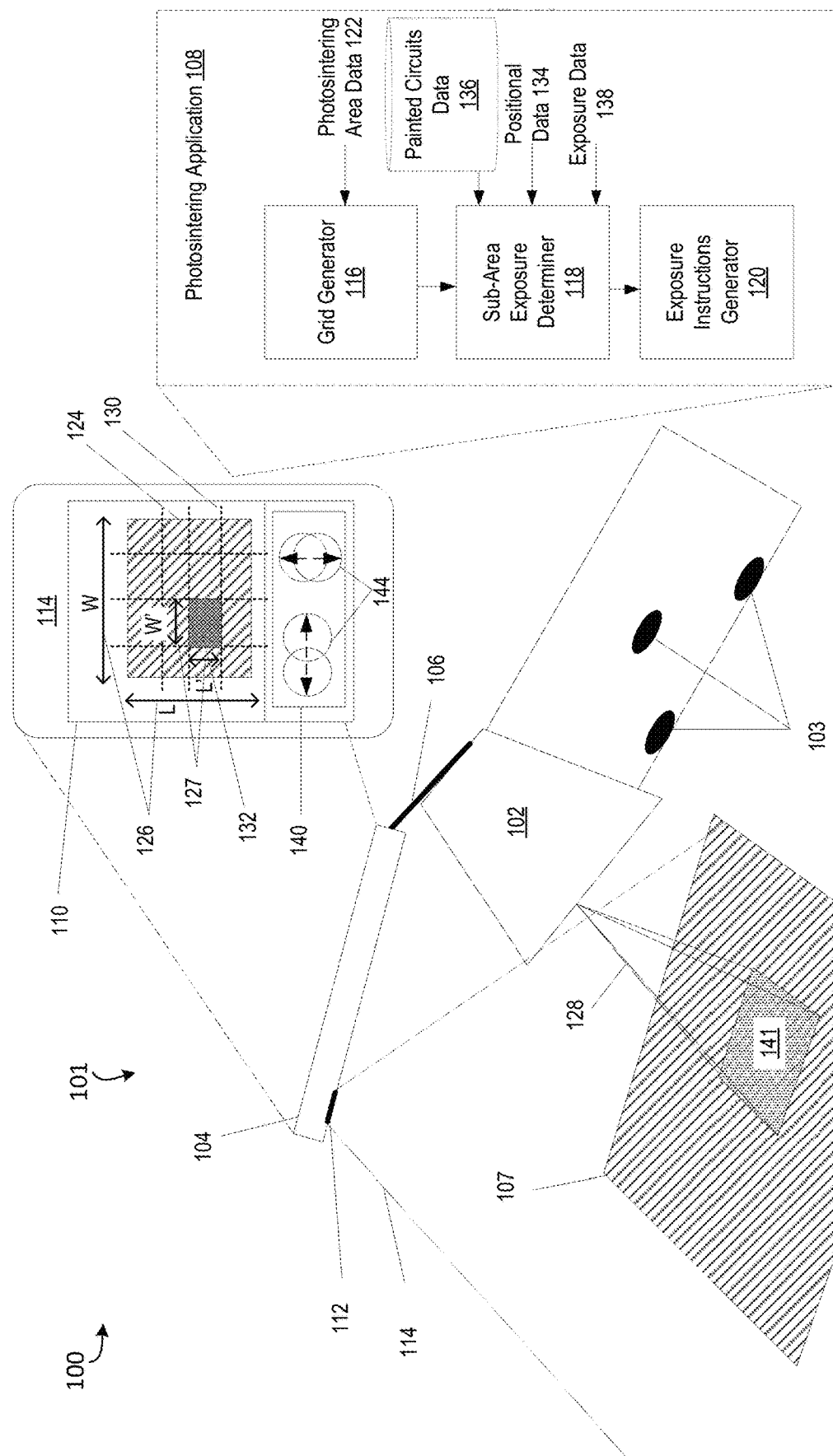
FIG. 1 is a block diagram of an example operating environment for a photosintering system.

Described below are systems, devices, and methods for sintering one or more paint layers for producing a solar paint circuit. A photosintering system can include a handheld photosintering device that can be used to sinter an area including one or more paint layers. The operation of the photosintering device can be controlled using a user's mobile device (or other appropriate device) that is in data communication with the photosintering device through a communication port (e.g., a serial port).

More particularly, the photosintering system can obtain information, e.g., an image of an area (e.g., captured by a camera on a user's mobile device) to be sintered and dimensions of the area to be sintered, and generate instructions that assist the user in performing the sintering, e.g., including instructions regarding the relative alignment of the photosintering device with respect to the area to be sintered, through a graphical user interface (GUI) of a photosintering application on the user's mobile device (or tablet device).

The photosintering application can apply a grid format to the area to be sintered, which separates the area to be sintered into multiple sub-areas. The photosintering application determines a sintering energy to be applied to the entire area to be sintered and also determines a sintering energy to be applied to each sub-area. The photosintering application tracks an amount and a profile of the sintering energy, e.g., an amount of time, a minimum energy, a maximum energy, a total energy, etc., that has been applied to the sintering area throughout the sintering process, e.g., at each step of the sintering process. A cumulative amount of sintering energy to apply to the sintering area can depend in part on an amount of energy required to sinter one or more painted layers of the sintering area such that the one or more painted layers of the sintering area achieve a desired set of layer properties.

In some implementations, the cumulative sintering is the energy required to sufficiently sinter nanoparticle-based paint layer(s), e.g., copper oxide nanoparticle paint layer, to form paint layer(s) having a desired set of properties, e.g., paint layer(s) that behave as electrically continuous and/or structurally continuous layer(s).

The cumulative amount of energy can be an amount of energy to effect a change in the chemical structure of the paint layer(s) in order to shift from paint layer(s) that behave as independent nanoparticles to paint layer(s) that behave as amorphous solid(s) through a process of densification and grain growth.

In some implementations, the cumulative amount of sintering energy can be tracked on a per-sub-area basis so as to track the sintering energy that has been applied to each sub-area, as well as how much additional sintering energy still needs to be applied to each sub-area in order for each sub-area to be sintered to achieve a particular set of properties, e.g., electrical properties, structural properties, etc. The multiple sub-areas of the sintering area can each include one or more of the same or different painted layer(s) where each sub-area can require a respective same or different amount of cumulative sintering energy in order to achieve a desired set of layer properties.

Multiple proximity sensors located on the photosintering device and/or images captured by the camera of the user's mobile device provide current positional information to the photosintering application. The photosintering application uses the current positional information to generate, and provide through the GUI, instructions (e.g., by way of text and/or graphical guides presented in the GUI) that assist to the user in aligning the photosintering device relative to the surface of the area to be sintered. For example, the instructions enable the user to position the photosintering device a particular distance from the surface of the area to be sintered and/or to position the photosintering device parallel to the surface of the area to be sintered.

In general, a paint circuit (e.g., a solar paint circuit) is created through a layer-by-layer application of electrically conductive paint (e.g., solar paint) to a surface of a substrate. The substrate can be, for example, a piece of wood, brick, plaster, stone, metal surface, or another surface to which paint can be applied. The application of layers of solar paint to the substrate can be done by hand using an aerosol dispenser, another aerosolized spray tool, etc.

Though the term "solar paint circuit," and "solar paint" are used in the context of describing particular embodiments of the subject matter, it is not meant to be limiting. Other paint circuits can be implemented which do not integrate solar energy (e.g., a battery, a light-emitting diode, an antenna, or other circuit elements), as well as paint layers that are not directly involved in forming solar-integrating circuits.

In some implementations, a painted circuit can be created by applying a single paint layer to a substrate. For example, a simple resistive circuit can be created by applying a single paint layer to the substrate. As discussed in more detail below, the paint layer applied to the substrate can be a conductive paint formulation having a resistance that is defined in part by a resistivity of a conductive material, e.g., nanoparticles, that is included in the conductive paint formulation and thickness of the paint layer. In some implementations, when conductive material with higher resistivity is included in the paint formulation, the resistance of the paint formulation will be higher than when conductive material with lower resistivity is included in the paint formulation.

In some implementations, a paint layer is applied through a template (e.g., a mask, stencil, and/or screen printing tool), such that paint is applied to a substrate in a portion of the template but is prevented from being applied to the substrate in a second, different portion of the template.

A paint layer can be applied using a paint brush, paint roller, or other painting tool. Paint for a paint layer can be aerosolized and applied to a substrate using an aerosol spray tool, spray can, or other aerosol dispensers. In some implementations, a paint layer can be applied using dip coating or doctor blade coating.

In some implementations, multiple paint layers are applied to the substrate to create a painted circuit. For example, after a first layer of paint is applied to the portion of the substrate, other layers can be applied to other portions of the substrate (e.g., adjacent to the first layer) and/or applied to already painted portions of the substrate (e.g., applied over the first layer of paint). Each layer of paint forms an electrical component of the painted circuit (e.g., an electron transport layer, a hole transport layer, etc.).

Adjusting a viscosity of the paint layer can change a thickness of the paint layer applied to the substrate, which in turn will affect the resistance of the paint layer. For example, a paint formulation with a higher viscosity will result in a thicker paint layer than a paint formulation with a lower viscosity, and thicker layers of paint will generally have higher resistance in a direction perpendicular to the plane of the layer than thinner layers of similar formulation.

In some implementations, a droplet size of a paint dispersed by an aerosolized sprayer determines, in part, a thickness of the paint layer applied to the substrate, which in turn will affect the resistance/conductance of the paint layer. For example, a larger droplet size of a paint dispensed by an aerosolized sprayer will result in a thicker paint layer than a smaller droplet size of the same paint dispensed by the aerosolized sprayer, and thicker layers of paint will generally have higher resistance in a direction perpendicular to the plane of the layer than thinner layers of similar formulation.

In some implementations, one or more paint layers can be sintered, for example using the photosintering system described herein, to yield structural and/or electrical properties of the one or more paint layers. Sintering of paint layers which include one or more nanomaterials, e.g., nanoparticles, can cause densification of the paint layers by agglomeration, reduction of porosity, and/or grain growth. Other sintering methods are possible, for example, a furnace, a rapid thermal processing system, or other system that provides elevated temperatures for a duration of a sintering process.

Sintering processes, as described below with reference to FIGS. 1-3 below, can be implemented at various stages of the fabrication process of a painted circuit. In some implementations, each painted layer of the one or more painted layers of the painted circuit are each sintered to produce an electrically and/or structurally complete painted layer prior to the application of a subsequent painted layer of the painted circuit. In some implementations, multiple painted layers, having different or the same compositions, can be sintered in a sintering process.

Various types of circuits and devices can be fabricated using painted layers including a solar cell described below with reference to FIG. 5. Other paint circuits can be created using the techniques described below, including a solar battery, where a solar cell charges a battery. Another example of a paint circuit is a solar-powered streetlight, including a solar cell, a battery, and a light-emitting circuit. Another example of a paint circuit is a solar cell including an output regulator to regulate the solar cell to a maximum power point of the solar cell, which can be used as part of a cell phone charging circuit. Various circuit elements, such as resistors, capacitors, diodes, and transistors, can be fabricated using the solar paint described herein.

Figure 5:
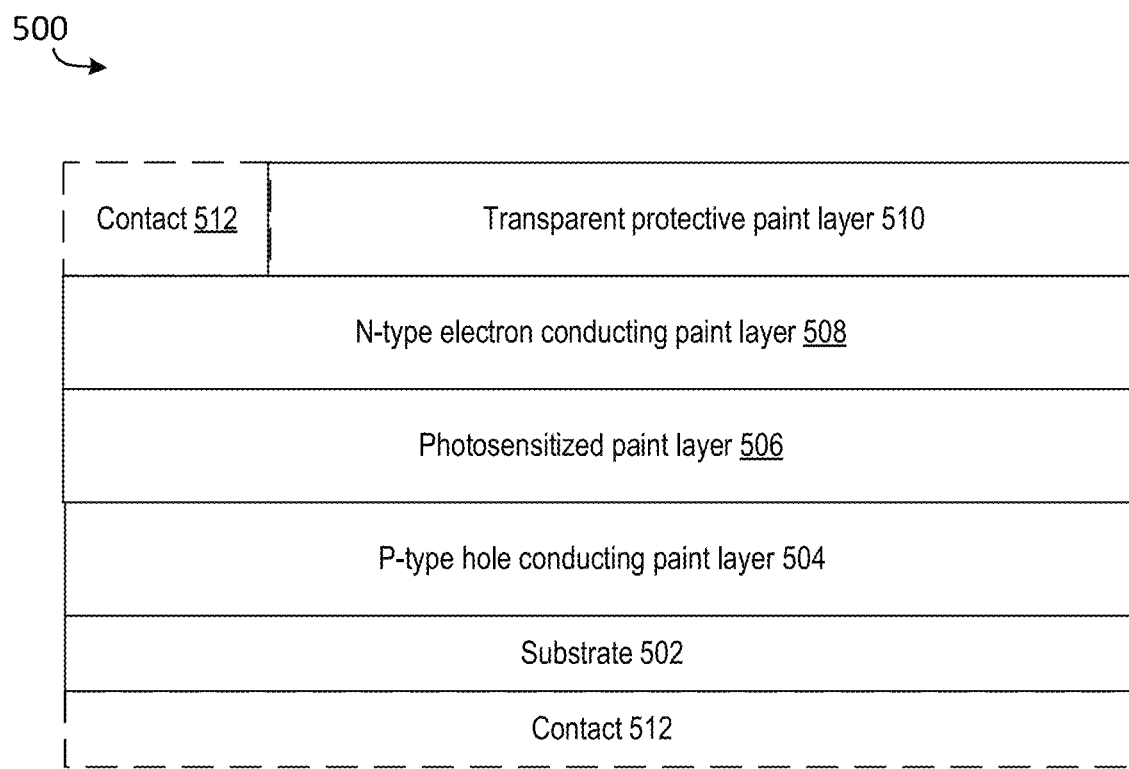
FIG. 5 is a block diagram of an example solar paint circuit.

Though the example circuit described below with reference to FIG. 5 is depicted in block diagram form as single layers of each respective paint layer, multiple applications (e.g., multiple layers) of particular paint layers can be used to achieve desirable electrical and/or functional properties. Additionally, though the example depicted below describes a single sub-circuit (e.g., a single solar cell) integrated and/or painted on one paint circuit, multiple sub-circuits may be incorporated and/or painted to form a larger paint circuit (e.g., multiple solar cells) to achieve desired device performance).

Photosintering System

FIG. 1 is a block diagram of an example operating environment 100 for a photosintering system 101. Photosintering system 101 includes a photosintering device 102 in data communication with a user device 104 over a data communication link 106.

Photosintering device 102 is a portable device including a high-energy light source, e.g., a xenon flash bulb, high-lumens light emitting diodes (LEDs), high-intensity infrared source, or the like. The high-energy light source delivers a controlled amount of light energy, for example, light intensity on the order of a few $kJ/mm^2$, e.g., 1 $kJ/mm^2$, 3 $kJ/mm^2$, 10 $kJ/mm^2$, etc., with a pulse duration on the order of microseconds, e.g., a few microseconds, tens of microseconds, etc. The photosintering device 102 can include multiple capacitors to charge the high-energy light source from an external power source, e.g., from a standard electrical power source available in a residence or commercial facility.

The photosintering device 102 includes a driver circuit that can digitally control the light energy delivery from the high-energy light source. The driver circuit can additionally include a discharge circuit that can safely discharge stored energy within the photosintering device when an external power source is disconnected, for example, using a high resistance discharge resistor or another similar method.

In some implementations, the photosintering device 102 includes an optical assembly having one or more optical components, for example, lenses, iris, filters, or the like to manipulate a beam of light from the high-energy light source. In one example, the optical assembly can include a collimating lens such that an output beam of light from the photosintering device is uniform over a diameter of the beam of light. In another example, the optical assembly can include a parabolic mirror to concentrate the light output from the high-energy light source. In another example, the optical assembly can include a laser and beam-splitter, where the high-light source is the laser and the beam-splitter is used to manipulate the beam of light from the laser.

Photosintering device 102 includes multiple proximity sensors 103. Proximity sensors 103 are devices that can measure a relative distance from the proximity sensor 103 to a surface, e.g., a surface of the sintering area 107 without physical contact between the proximity sensors 103 and the surface. Proximity sensors 103 can be, for example, optical proximity sensors. Photosintering device 102 can include one or more proximity sensors 103 that can be used to determine a distance of the photosintering device 102 to a surface of the sintering area 107.

In some implementations, photosintering device 102 includes at least 3 proximity sensors 103, where the proximity sensors 103 are arranged on the body of the photosintering device such that location data from the proximity sensors 103 can provide information about the relative orientation of the photosintering device 102 with reference to a surface, e.g., tip/tilt, rotation, levelness, etc. In one example, three proximity sensors 103 can be arranged in a triangular shape on the body of the photosintering device 102. In particular, the proximity sensors can determine if a beam of light from the high-energy light source is perpendicular to a particular surface, e.g., a sintering area 107.

In some implementations, the proximity sensors 103 can be two or more cameras having the ability to capture depth perception data for the photosintering system 102 and having sufficiently high-resolution to distinguish features on the surface of the sintering area 107. The camera(s) can be used to determine a relative location of the photosintering device 102 with respect to a coordinate plane of the surface of the sintering area 107.

In some implementations, the proximity sensors 103 can be a light detection and ranging (LiDAR) sensor having topological mapping capability, where the LiDAR sensor has a resolution at a nanometer-scale to analyze features of the sintering area surface. Further details regarding measuring an orientation of the photosintering device 102 relative to the sintering area 107 are provided below with reference to FIGS. 2 and 3.

In some implementations, a distance of the photosintering device 102 relative to the surface of the sintering area 107 can be determined in part using a reference measurement tool, e.g., a ruler or a tool of known length, to provide a visual cue. Image recognition software including a neural network can be used to recognize a shape and orientation of the reference measurement tool and convert the appearance of the tool with respect to the photosintering device 102 and sintering area 107 into a distance between the photosintering device 102 and the surface of the sintering area 107.

In some implementations, user device 104 is a mobile device (or tablet device) that hosts one or more native applications, for example, photosintering application 108. Photosintering application 108 includes an application environment 110 (e.g., a graphical-user interface (GUI)) through which a user of the user device 104 may interact with the photosintering application 108. The user device 104 may be a cellular phone or a non-cellular locally networked device with a display. The user device 104 could also be a mobile phone, a smart phone, a tablet PC, a personal digital assistant ("PDA"), or any other device configured to communicate over a network and display information. In some implementations, a user device 104 may also include other communication devices, and handheld or portable electronic devices for gaming, communications, and/or data organization. The user device 104 may perform functions unrelated to the photosintering application 108, such as placing personal telephone calls, playing music, playing video, displaying pictures, browsing the Internet, maintaining an electronic calendar, etc.

User device 104 includes a camera 112, e.g., a camera included in a smartphone, tablet, or other mobile device. Camera 112 includes a field of view 114 and can be used to capture video and image data of a scene within the field of view 114 of the camera 112. Photosintering application 108 can access camera 112 and collect imaging data during a photosintering process. Further details related to collecting imaging data is described below with reference to FIGS. 2 and 3.

In some implementations, photosintering device 102 may include a camera 112 that can be utilized alternatively or additionally to the camera 112 on the user device 104 by the photosintering system 101 to capture image or video data during a photosintering process.

As depicted in FIG. 1, front view 114 of user device 104 includes an application environment 110, e.g., a graphical user interface (GUI), for a user of the user device 104 to interact with a photosintering application 108.

Data communication link 106 enables the transfer of information between the photosintering device 102 and the user device 104. In some implementations, data communication link 106 is a cable link, e.g., a serial cable, a USB cable, a coaxial cable, HDMI cable, or the like, that enables the transfer of data between the photosintering device 102 and the user device 104 using a particular communication protocol. The cable includes respective connectors that are compatible with the cable and selected based in part on available ports on the user device 104 and the photosintering device 102. In the example of a serial cable, a serial communication protocol is utilized and the respective connectors on the serial cable to connect to respective ports on the photosintering device 102 and mobile device 104. In another example, data communication link 106 is a USB cable.

In some implementations, data communication link 106 is a part of a network that is configured to enable the transfer of information between the photosintering device 102 and the user device 104. The network may include, for example, one or more of the Internet, Wide Area Networks (WANs), Local Area Networks (LANs), analog or digital wired and wireless telephone networks (e.g., a public switched telephone network (PSTN), Integrated Services Digital Network (ISDN), a cellular network, and Digital Subscriber Line (DSL)), radio, television, cable, satellite, or any other delivery or tunneling mechanism for carrying data.

The network may include multiple networks or subnetworks, each of which may include, for example, a wired or wireless data pathway. The network may include a circuit-switched network, a packet-switched data network, or any other network able to carry electronic communications (e.g., data or voice communications). For example, the network may include networks based on the Internet protocol (IP), asynchronous transfer mode (ATM), the PSTN, packet-switched networks based on IP, X.25, or Frame Relay, or other comparable technologies and may support voice using, for example, VoIP, or other comparable protocols used for voice communications. The network may include one or more networks that include wireless data channels and wireless voice channels. The network may be a wireless network, a broadband network, or a combination of networks including a wireless network and a broadband network.

In some implementations, data communication link 106 is a wireless connection over the network, for example, over Wi-Fi, Bluetooth, Bluetooth LE, ZigBee, Z-wave, or another method for short-range wireless communication protocol, where the user device 104 and photosintering device 102 communicate over a wireless connection.

The photosintering application 108 is depicted in FIG. 1 as an application hosted on user device 104. In some implementations, a portion or all of the computations performed by the photosintering application 108 can be hosted on a remote server in data communication with the user device 104 and/or photosintering device 102 over the network.

Photosintering application 108 can include a grid generator 116, a sub-area exposure determiner 118, and an exposure instructions generator 120. Though depicted in FIG. 1 as a grid generator 116, a sub-area exposure determiner 118, and an exposure instructions generator 120, the operations described herein with reference to each of the grid generator 116, sub-area exposure determiner 118, and exposure instructions generator 120 can be performed by more or fewer modules that include one or more processors.

The grid generator 116 receives, as input, photosintering area data 122 related to the sintering area 107. Photosintering area data 122 includes image(s) 124 of the sintering area 107, dimension(s) 126 of the photosintering area, and an initial alignment of the proximity sensors 103 relative to the sintering area 107.

In some implementations, photosintering area data 122 includes composition data for the sintering area 107, where composition data can include, for example, a width and a length of one or more painted layers of the sintering area 107, e.g., dimension 126, layer thicknesses of the one or more painted layers of the sintering area 107, and/or material composition of the one or more painted layers of the sintering area 107. Painted layers are discussed in further detail below with reference to FIGS. 4 and 5.

In some implementations, photosintering area data 122 includes characteristics of the photosintering device 102, for example, characteristics of exposure beam 128. Exposure beam 128 can have an associated beam spot size and beam intensity profile. Other characteristics can include a range of available light source intensities, an amount of recharge time between flashes of the light source, e.g., in the case of a flash-lamp, and wavelength(s) of the light source.

The grid generator 116 generates, as output and based in part on the photosintering area data 122, a grid 130 for the sintering area 107. Grid 130 divides the sintering area 107 into multiple sub-areas 132, where each sub-area 132 is a fractional area of the total area of the sintering area 107. Each sub-area 132 of the multiple sub-areas has respective sub-area dimensions 127, e.g., width W' and length L'. Respective locations within the grid 130 and sub-area dimensions 127 of each sub-area 132 can depend on characteristics of the photosintering device, e.g., a range of available exposure energies for the photosintering device 102, a resolution of the high-energy light source for the photosintering device 102, or other characteristics that can affect the energy output of the photosintering device 102. Further details related to generating a grid 130 by the grid generator 116 are included in the discussion of FIG. 3 below. Note that rectangular sub-areas are presented for purposes of example, but that any other appropriate shapes can be used to define the sub-areas.

The sub-area exposure determiner 118 receives, as input, the grid 130 applied to the sintering area 107 and positional data 134 for the photosintering device 102. Positional data 134 includes a relative position of the photosintering device 102 with respect to the sintering area 107. Positional data 134 can be provided to the photosintering application 108 by the proximity sensors 103 via the data communication link. Positional data can include, for example, a tip/tilt of the photosintering device 102 relative to a surface of the sintering area 107. For example, the proximity sensors 103 can detect that the photosintering device is oriented such that the photosintering device is not parallel with respect to the surface of the sintering area 107.

In some implementations, positional data 134 can include an orientation of the photosintering device 102 relative to one or more edges of the sintering area 107. For example, the proximity sensors 103 can detect a difference in material composition, e.g., by a difference in reflectivity, between the surface of the sintering area 107 and a surface that is not the sintering area 107, e.g., a bare substrate. The edge location information from the proximity sensors 103 can be used by the photosintering application 108 to determine a relative position of the photosintering device 102 relative to the sintering area 107.

In some implementations, positional data 134 can include real-time images 134 captured of the sintering area 107, where at least a portion of the photosintering device 102 is captured within the field of view 114 of the camera 112. The photosintering application 108 can determine, based on a position of the photosintering device 102 relative to the sintering area 107, as captured in image 134, a location of the photosintering device 102 relative to the grid 130. The positional data 134 derived from real-time images 134 can be utilized in combination with proximity data from the proximity sensors 103 to determine a distance between the photosintering device 102 and a surface of the sintering area 107.

In some implementations, sub-area exposure determiner 118 can access a database of painted circuits data 136. Painted circuits data 136 includes fabrication and structural information related to painted circuits, e.g., layer composition, layer thickness, layering structure, and the like. Painted circuits data 136 can include fabrication and structural information related to multiple different painted circuits, for example, a solar painted circuit, a battery painted circuit, a light-emitting diode painted circuit, and the like. Each painted circuit in the painted circuit data 136 can include respective information for fabricating the particular painted circuit including step-by-step instructions for painting each layer of the painted circuit, annealing and/or sintering each layer of the painted circuit, etc. More details about fabrication of painted circuits are included with reference to FIGS. 4 and 5 below.

The sub-area exposure determiner 118 can generate, as output, a fractional sintering energy for each sub-area 132 of the sintering area 107. The fractional sintering energy for each sub-area 132 can be generated based in part on the positional data 134 of the photosintering device 102, the grid 130 including multiple sub-areas 132, and sintering requirements for each sub-area of the sintering area 107. Sintering requirements for each sub-area of the sintering area 107 includes a cumulative amount of energy required to sinter the layer(s) of the sub-area of the sintering area 107 in order to achieve a set of desired properties, e.g., electrical properties, structural properties, or the like. Sintering requirements additionally include a minimum threshold amount of energy that is required to induce a sintering process in the layer(s) of the sub-area. In other words, an amount of energy required to raise the kinetic energy, e.g., temperature, of the painted layer(s) of the sub-area such that the nanoparticles of the painted layer(s) undergo a process of densification and grain growth. In some implementations, the minimum threshold of energy is an amount of energy that is sufficiently in excess of an energy required to overcome an enthalpy of formation of a solid for the particular layer(s).

The sub-area exposure determiner 118 can determine dimensions, e.g., a rectangular area, of the sub-area 132 based in part on the grid 130 applied to the sintering area 107. Positional data 134 of the photosintering device is a distance of the photosintering device 102 from a surface of the sintering area 107 which can be used to determine an energy density at the surface of the sintering area 107 for an exposure, e.g., the exposure energy delivered to the exposure area 141 by of the photosintering device 102, which can be used by the sub-area exposure determiner 118 to determine a number of exposures of the photosintering device 102 required to sinter the sub-area 132, e.g., based in part on a relative size of the exposure area 141 and the area of the sub-area 132.

In some implementations, the sub-area exposure determiner 118 can determine a cumulative sintering energy for the sintering area 107 based in part on composition data for the sintering area 107. The cumulative sintering energy corresponds to an amount of energy required to sinter the one or more painted layers of the sintering area 107 in order to achieve a set of desired properties, e.g., electrical properties, structural properties, or the like. For example, the cumulative sintering energy can correspond to an amount of energy required to sinter the one or more painted layers in order to achieve a minimum size grain in the painted layers and a minimum conductivity of the painted layers. The sub-area exposure determiner 118 can use the cumulative sintering energy for the sintering area 107 to determine a fractional sintering energy for a particular sub-area 132 of the sintering area 107, e.g., based on a relative area of the sub-area 132 compared to the area of the sintering area 107.

In some implementations, each sub-area 132 of the grid 130 requires multiple exposures, e.g., if an amount of cumulative energy required to sinter the sub-area in order to achieve the desired properties exceeds a maximum energy output of the high-energy light source of the photosintering device 102. Further details related to the sub-area exposure determiner 118 are found below with reference to FIGS. 2 and 3.

The exposure instructions generator 120 receives, as input, the exposure requirement for each sub-area 132 of the sintering area 107 including a fractional sintering energy for the sub-area 132, dimensions of the sub-area 132 and location of the sub-area 132. The exposure instructions generator 120 generates, as output, instructions for the photosintering device 102, including exposure energy, time of exposure, triggering of exposure, and the like.

In some implementations, the exposure instructions generator 120 provides an indication through the application environment 110 to the user of user device 104 to guide the user to position the photosintering device 102 such that the exposure beam 128 of the photosintering device 102 is oriented in a correct location and orientation with respect to a particular exposure area 141.

In some implementations, the indication provided through the application environment 110 to the user of the user device 104 can include alignment cues 142 in the application environment 110. Alignment cues 142 can include orientation, e.g., tip/tilt, rotation, etc., and position, e.g., left/right, up/down, that are visual, textual, and/or audio-based. In one example, an alignment cue 140 is as depicted in FIG. 1, where a relative movement of overlapping circles 144 can indicate if the photosintering device 102 is level with respect to a surface of the sintering area 107. In another example, an alignment cue 140 can be a textual cue "move the photosintering device closer to the photosintering area." In yet another example, an alignment cue 140 can be an audio-based cue, e.g., delivered through an internal speaker of the user device 104. The audio-based cue can be spoken dialog, e.g., "please move the photosintering device to your left," or a non-dialog based cue, e.g., a series of beeps that increase in frequency as the photosintering device is appropriately aligned.

In some implementations, the indication provided through the application environment 110 to the user of the user device 104 can include a panoramic or wide-angle scanning view of the sintering area 107 including arrows, overlapping targets, or other alignment cues 142 for the user to adjust a position of the photosintering device 102, e.g., in a panning motion.

Though described with respect to FIG. 1 as a photosintering system 101 including a user device 104 and a photosintering device 102 where a user is controlling a position, e.g., by holding each respective device, other implementations of the photosintering system 101 are possible.

For example, the photosintering system 101 can be deployed in a factory setting, for example, as a part of a roll-to-roll manufacturing process. For a roll-to-roll manufacturing process, the roll of material to be sintered using the photosintering system 101 can be first divided into a primary unit of area of width and length, where a width can depend on a width of the roll of material and a length can be determined by a number of deployed photosintering devices 102 in the photosintering system. The primary unit of area can be defined as the sintering area 107 as described above, which is subsequently divided into multiple sub-areas 132 using a grid 130.

In some implementations, the photosintering system includes multiple photosintering devices 102 which can be controlled using a photosintering application on a single, or multiple, user devices. A user device can additionally be a computer or other processing unit, where a camera 112 can be an external camera in data communication with the user device 104.

In some implementations, indicating positional information, e.g., a position of the photosintering device 102 relative to a surface of a particular sub-area 132, includes transmitting instructions to an automated controller that controls a relative position of the photosintering device 102 relative to the particular sub-area 132, e.g., using servo-motors and a mechanical rail system, to alter the orientation of the photosintering device 102 relative to the particular sub-area 132. In one example, the automated device is a part of a computer-controlled automated positioning and alignment system.

In some implementations, indicating position information, e.g., a position of the photosintering device 102 relative to a surface of a particular sub-area 132, includes transmitting instructions to an automated controller that controls operations of a reel-to-reel fabrication system including multiple atomizers, dryers, and photosintering devices, e.g., multiple flash lamps, or that includes multiple reel-to-reel sub-systems for each painted layer of the painted circuit, where each reel-to-reel sub-system includes a respective photosintering device.

Example Operation of a Photosintering System

Figure 2:
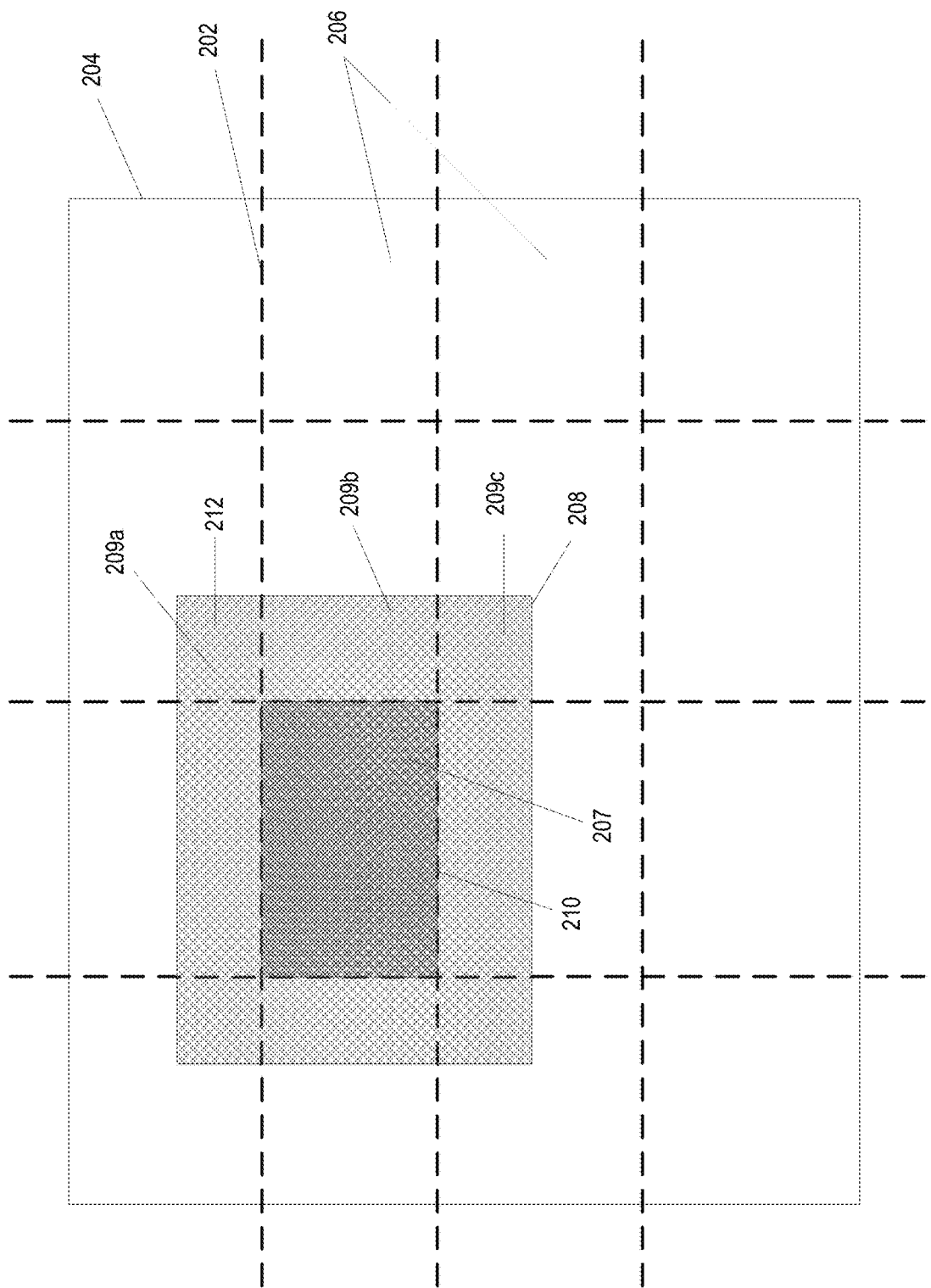
FIG. 2 is a block diagram of an example grid applied to a photosintering area.

FIG. 2 is a block diagram 200 of an example grid 202 applied to a sintering area 204. Grid 202 divides sintering area 204 into multiple sub-areas 206. In one example, grid 202 divides sintering area 204 into a one millimeter resolution grid, where each sub-area 206 is 1 mm×1 mm in dimension. In some implementations, an exposure area 208 of an exposure beam of the photosintering device can have a distributed beam profile, e.g., a Gaussian distribution or the like. The distributed beam profile can have a non-uniform beam intensity that decreases in intensity with distance from a center point of the exposure area 208. The non-uniform beam intensity can result in regions of high energy exposure and regions, e.g., at the edge of the exposure area 208, of lower energy exposure for each exposure of the photosintering device on the sintering area 202. In one example, as depicted in FIG. 2, the exposure area 208 includes a higher energy exposure area 210 overlapping with sub-area 207 and a lower energy exposure area 212 which overlaps with multiple other sub-areas, for example, overlapping sub-areas 209a, 209b, 209c.

The photosintering application 108 can track an amount of energy exposure for each sub-area 206, including lower energy exposure 212 due to overlap between an exposure area 208 and adjacent sub-areas 209a, 209b, 209c, to calculate a cumulative amount of energy exposure at each sub-area. Lower energy exposure 212 due to overlap that is determined to be in excess of a minimum threshold amount of energy required to induce a sintering process in the area of exposure, e.g., 209a, 209b, 209c, is tracked in order to determine a total amount of exposure in each sub-area.

Tracking the amount of energy exposure for each sub-area by the photosintering application 108 can include, recording, for each exposure and using a location of the exposure area 208 relative to the grid 202 of the sub-area 206, an amount of energy exposure received by each sub-area 206, including sub-areas 206 that receive overlap exposure 209a, 209b, 209c because they are adjacent to a particular sub-area 207 being exposed.

The photosintering application 108 can track an amount and a profile of the sintering energy applied over the sub-area 207, e.g., an amount of time of exposure, a minimum energy exposed, a maximum energy exposed, a cumulative energy exposed, etc. The photosintering application 108 can record an exposure amount and exposure location with respect to the sub-area 207 (e.g., full or partial exposure of the area of the sub-area 206) for each sub-area. A cumulative amount of energy exposure at each sub-area can be added together over the multiple exposures of the sintering process.

$$\Sigma((E_i-E_0)*n) > (\Delta H_N - \Delta H_S) \quad (1)$$

where $E_i$ is the energy of an exposure, $E_0$ is the minimum threshold energy required to induce a sintering process, n is the number of flashes, $\Delta H_N$ is the enthalpy of the initial nanoparticle painted layers of the sub-area, and $\Delta H_S$ is the enthalpy of fully densified painted layers of the sub-area having a same number of total molecules.

In some instances, a particular sub-area 206 is not exposed during every exposure, e.g., an edge sub-area on one edge of the sintering area 204 is not exposed when another edge sub-area on an opposite edge of the sintering area 204 is exposed. In some instances, a particular sub-area 206 can receive a lower energy exposure over a portion or all of the sub-area 206, where the lower energy exposure is below the minimum threshold amount of energy required to induce a sintering process such that the lower energy exposure can be disregarded. For example, a particular sub-area can have a minimum threshold required energy of 140 J/mm$^2$ and can receive, for three total exposures in the sintering process: 20 J/mm$^2$, 150 J/mm$^2$, and 160 J/mm$^2$, for a cumulative amount of exposure energy for the particular sub-area of 310 J/mm$^2$.

In some situations, an amount of exposure energy required to sinter a particular sub-area in order to achieve a set of desired properties, e.g., a particular material composition of paint layer(s), exceeds an energy output of a flash of a photosintering device. In these situations, the sub-area exposure determiner 118 can determine that multiple exposures, e.g., two exposures, by the photosintering device 102 of the sub-area 132 can be required to sinter the sub-area 132. For example, a threshold amount of energy to sinter a particular sub-area is 70 J/mm$^2$, an amount of exposure energy required to achieve a desired grain growth and densification of the painted layers in a sub-area can be cumulative energy amount of 150 J/mm$^2$, and an energy output of the photosintering device at a particular distance from the surface of the sub-area is 75 J/mm$^2$. In this example, two exposures, e.g., two flashes of the flashbulb or two pulses of the high-energy LEDs, are required to sinter the sub-area.

A particular amount of cumulative exposure energy to sinter the sub-area 132 in order to achieve a desired set of properties, e.g., an amount of grain growth and densification and/or electrical properties, can be less than a single exposure energy provided by the photosintering device, e.g., less than at the energy provided at a particular light intensity output of the lamp of the photosintering device when the photosintering device is located a particular distance from the surface of the sub-area. In some implementations, beam attenuation through use of a filter, e.g., a neutral density filter, can be used to reduce an energy output to achieve the appropriate amount of exposure. The energy output can additionally be reduced by increasing a distance between the photosintering device and the surface of the sub-area, thereby reducing the intensity of the beam on the surface of the sub-area. Alternatively, or additionally, a pulse or duration of the light exposure or beam intensity can be reduced to reduce an amount of total photosintering energy exposed to the sub-area.

In some implementations, exposure energy at the surface of the sub-area 132 is attenuated by moving the photosintering device to a distance further away from the surface of the sub-area. Adjusting the distance between the photosintering device and the surface of the sub-area can result in additional overlap exposure, e.g., 209a, 209b, 209c, of adjacent sub-areas. Additional overlap exposure energy can result in a recalculation of the number and/or energies of the respective exposure(s) for each of the adjacent sub-areas that are affected by the overlap exposure. In some instances, recalculation can account for the lower energy exposure of a particular adjacent sub-area due to overlap exposure by reducing a number of exposures that are centered at the particular adjacent sub-area, where the lower energy exposure is in excess of a minimum threshold of energy required to sinter the adjacent sub-areas. For example, an adjacent sub-area receives overlap exposure energy of 15 J/mm$^2$ which is greater than a minimum threshold of energy to sinter the adjacent sub-area of 10 J/mm$^2$ and requires a cumulative amount of exposure energy of 100 J/mm$^2$ to sinter the material of the adjacent sub-area to form a sufficiently electrically and structurally contiguous layer. An exposure sintering energy of 85 J/mm$^2$ is determined for the adjacent sub-area where the exposure area 208 of 85 J/mm$^2$ exposure sintering energy is centered over the adjacent sub-area, e.g., aligned over a center point of the adjacent sub-area.

In some implementations, an iterative process is performed by the photosintering application 108 to optimize a sequence of exposures by the photosintering device 102 over the multiple sub-areas 206 of the sintering area 202 in order to deliver the fractional exposure energy required to sinter each sub-area 202 through the sequence of exposures. The optimization of the sequence of exposures can be performed prior to beginning a sintering process, e.g., using a simulation environment.

In some implementations, a sequence of multiple exposures to sinter each sub-area of the multiple sub-areas is different for each sub-area of the multiple sub-areas. For example, a first sub-area of the multiple sub-areas of the sintering area 204 at a central position relative to the sintering area 204 can receive two exposures of intensity of 60 J/mm$^2$, but an adjacent sub-area, which experienced an amount of overlap exposure over a portion of the sub-area, will receive one exposure with light source intensity 60 J/mm$^2$ and one exposure of lower light source 30 J/mm$^2$, which is still in excess of a minimum threshold amount of, e.g., 15 J/mm$^2$, to sinter the sub-area, over a portion of the sub-area that avoids the previously exposure area of overlap. The photosintering application 108 can utilize a tensorflow formulism to perform optimization of the sub-area exposures, as described in further detail with reference to FIG. 3 below.

In some implementations, a pulse of the light source is sufficiently long, e.g., greater than a few microseconds, such that photosintering application 108 tracks the thermal conductivity of the layers of the sintering area to determine a rate of dissipation or thermal spreading of the pulse provided by the photosintering device to the sintering area 107. For example, for a high energy light source operating in a continuous or nearly-continuous mode, the photosintering application 108 additionally tracks and accounts for a rate of thermal energy dissipation in the layer(s) of the sintering area in order to calculate the cumulative amount of sintering energy provided to the sintering area 107.

Figure 3:
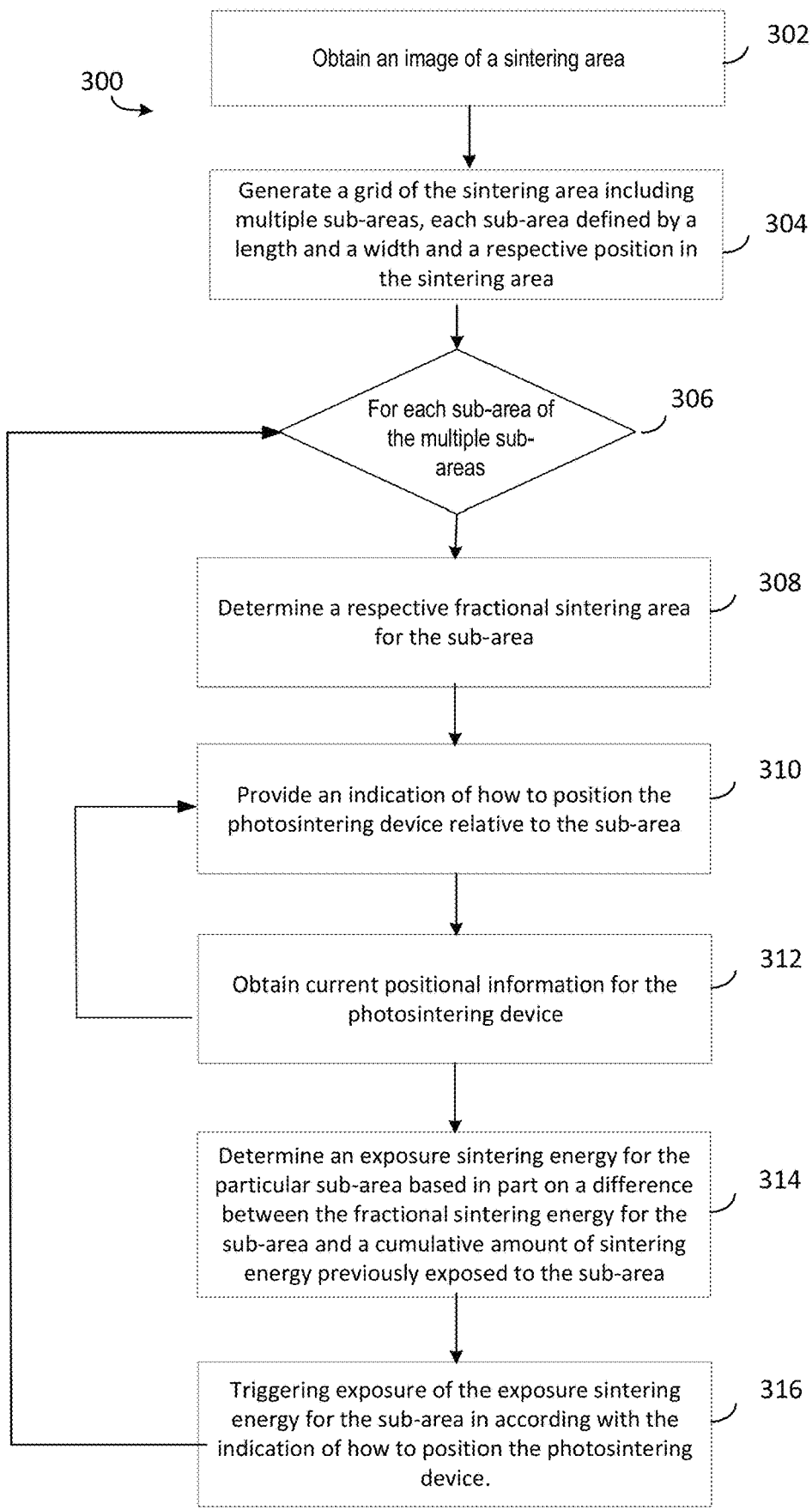
FIG. 3 is a flow diagram of an example process for the photosintering system.

FIG. 3 is a flow diagram of an example process 300 for the photosintering system. An image is obtained of a sintering area (302). The image 124 of the sintering area 107 can be captured by a camera 112 of a user device 104, e.g., by a user of the user device 104. In some implementations, the photosintering application 108 can provide guidance to the user through the application environment 110 for capturing the image 124 of the sintering area 107. For example, the application environment 110 can include an outline and/or alignment marks to indicate how the user should position the camera 112 to capture the sintering area 107 in image 124.

In some implementations, dimensions 126 of the sintering area 107 are provided by a user, e.g., a length L and a width W of the sintering area 107. The user may specify units of the dimensions, e.g., inches, centimeters, etc. The photosintering application 108 may query the user to input one or more dimensions 126 through the application environment 110, where the query is responsive to an upload of the image 124 of the sintering area 107.

A grid of the sintering area is generated, including multiple sub-areas for the sintering area, where each sub-area is defined by a length and a width and a respective position in the sintering area (304). Grid generator 116 can generate grid 130 using photosintering data 122 including image 124 of the sintering area 107 and dimensions 126. In some implementations, each sub-area 132 of the multiple sub-areas of the grid have same sub-area dimensions 127, e.g., W' and L'.

In some implementations, features of the sintering area can be determined from image(s) 124 and can be used as alignment points of the grid 130. Features of the sintering area can include, for example, non-uniformities in one or more paint layers of a painted circuit, alignment marks on a foil bottom contact layer of the painted circuit, alignment marks made by a user on the painted layers to be used alignment points, etc. Photosintering application 108 can determined multiple features in the sintering area and use the features to determine relative locations of each sub-area 132 of the multiple sub-areas of the grid 130. For example, a particular sub-area can be determined to have a feature, e.g., a surface roughness, in an upper-left corner of the particular sub-area. The photosintering system 108 can utilize the identified surface roughness to determine a position of a particular sub-area 132 in the gird 130. In another example, features are hash marks that can be used as alignment points by the photosintering system 108 to identify locations of sub-areas 132 of the grid 130.

In some implementations, composition data for each sub-area of the multiple sub-areas is obtained, where composition data can include dimensions 127 of the sub-area, e.g., W' and L', layer thicknesses of one or more painted layers of the sub-area 132, and material composition of the one or more painted layers of the sub-area 132. In one example, adjacent sub-areas in the sintering area 107 can have different composition data, where a first sub-area can have a first set of dimensions 127 and a second sub-area adjacent to the first sub-area can have a second set of dimensions 127, In another example, different composition data between two adjacent sub-areas can be a difference in the one or more painted layers of the respective sub-areas, e.g., where a first sub-area includes three painted layers of composition X and a second sub-area includes 3 painted layers of composition X and one painted layer of composition Y.

For each particular sub-area of the multiple of sub-areas, the photosintering system iterates the following process until reaching an optimized set of exposures for the sintering process (306), the process including: a respective fractional sintering energy is determined for the particular sub-area (308). A fractional sintering energy for a sub-area 132 can depend in part on composition data for the sub-area, e.g., the material compositions of one or more painted layers in the sub-area, a width and length of the one or more painted layers in the sub-area, and/or layer thicknesses of the one or more painted layers in the sub-area.

The fractional sintering energy for the sub-area 132 is the energy required to sinter one or more layers of the sub-area. The fractional sintering energy is an amount of energy required to achieve a set of properties, e.g., to anneal the one or more layers of the sub-area and effect a change in the chemical structure of the thin film of electronically independent nanoparticles to an amorphous solid by facilitating densification and grain growth having a lowest possible surface energy. In one example, the sub-area 132 includes a layer of copper oxide (CuO) nanoparticles and a fractional sintering energy for the sub-area 132 corresponds to a photosintering energy required to sinter the CuO nanoparticles to form an electrically and/or physically complete layer. In another example, the sub-area 132 includes multiple layers including, a layer of CuO nanoparticles, a layer of titanium dioxide (TiO2) nanoparticles, a layer of photosensitized dye compound, a layer of aluminum zinc oxide (AZO) nanoparticles or indium tin oxide (ITO) nanoparticles and a fractional sintering energy for the sub-area 132 corresponds to a photosintering energy required to sinter the layers to each form electrically and/or physically complete layers.

In some implementations, fractional sintering energy for the sub-area 132 can be determined based on painted circuits data from database 136. A user can provide information relating to a particular painted circuit including one or more paint layers in the painted circuit, and the photosintering system 108 can determine a fractional sintering energy for the sub-area 132 using the painted circuits database 136. For example, a user can indicate that the sintering area 107 is a painted circuit including a layer of titanium dioxide (TiO2) nanoparticles. The photosintering system 108 can determine, based on the provided layer composition, a particular cumulative exposure energy required to sinter the TiO2 nanoparticles to form an electrically-continuous TiO2 layer, using the painted circuit data from database 136.

An indication of how to position the photosintering device 102 relative to the particular sub-area 132 is provided (310). The indication of the positional information can be presented to the user via a display in the application environment 110 on the user device 104. The indication can be, for example, alignment cues 140 as described above with reference to FIG. 1.

In some implementations, an alignment cue 140 can include outlining, highlighting, or otherwise providing a visual indication of the particular sub-area 132 to be sintered. Arrows or other direction indicators can be superimposed on an image 124 depicting a current view of the sintering area 107 in the application environment 110 to direct the user to position the photosintering device 102 with respect to the particular sub-area.

Current positional information for the photosintering device is obtained (312). Positional data 134 can include alignment and orientation information from the proximity sensors 103 on the photosintering device 102. In one example, current positional information for the photosintering device includes a location of the photosintering device 102 relative to one or more edges of the sintering area 107, a distance of the photosintering device 102 from a surface of the sintering area 107, tip/tilt of the photosintering device 102 relative to the surface of the sintering area 107, etc. In another example, current positional information for the photosintering device 102 includes a real-time image 134 of the sintering area 107 captured by camera 112 including at least a portion of the photosintering device 102 within the field of view 114 of the camera 112. In yet another example, current positional information for the photosintering device 102 includes capturing one or more images of the sintering area 107 including one or more painted layers on a substrate.

The photosintering system 108 determines that the current positional information indicates that the photosintering device is positioned relative to the particular sub-area in accordance with the indication of how to position the photosintering device (314). The photosintering system 108 can determine, based on the positional data 134 and the grid 130 that the photosintering device 102 is in a correct position to expose the particular sub-area 132. In one example, determining that the current positional information indicates that the photosintering device is positioned relative to the particular sub-area 132 in accordance with the indication includes determining, based on proximity data from the proximity sensors 103 on the photosintering device 102, that the photosintering device 102 is parallel with respect to the particular sub-area 132.

In some implementations, an iterative process can be performed where current positional information for the photosintering device 102 is obtained and a subsequent indication of how to position the photosintering device 102 is provided responsive to the current positional information until the photosintering device 102 is determined to be in a correct position.

An exposure sintering energy for the particular sub-area is determined based in part on a difference between the fractional sintering energy for the particular sub-area and a cumulative amount of sintering energy previously exposed to the particular sub-area (316). As described above with reference to FIG. 2, a particular sub-area can be partially or fully exposed by overlap exposure (.e.g., overlap 209a) due to an exposure of an adjacent sub-area (e.g., sub-area 207). The photosintering system 108 can determine a cumulative amount of sintering energy previously exposed to the particular sub-area by overlap exposure from adjacent sub-areas as well as previous exposures of the particular sub-area, e.g., in an instance where a sub-area requires multiple exposures to sinter the material of the sub-area, and where each exposure is in excess of a minimum threshold exposure energy to induce a sintering process for the sub-area. For example, a fractional sintering energy for a sub-area 132 is 150 $J/mm^2$, a cumulative amount of sintering energy previously exposed is 100 $J/mm^2$, and a minimum threshold energy is 60 $J/mm^2$. The exposure sintering energy will therefore be 60 $J/mm^2$ for the exposure, in order to exceed the minimum threshold energy of 60 $J/mm^2$ and reach at least the cumulative amount of sintering energy.

An exposure is triggered of the exposure sintering energy to the particular sub-area in accordance with the indication of how to position the photosintering device (318). Once the photosintering device 102 is determined to be in the indicated position, e.g., within a particular distance of a surface of the sub-area and oriented parallel to the surface of the sub-area, a triggering signal is sent to the photosintering device 102 by the photosintering application 108. The triggering signal can direct the photosintering device to expose the sub-area 132. The exposure of the sub-area can be, for example, a flash of a flash-lamp light source, or a pulse of a light source for a particular duration of time, according to the exposure sintering energy.

In the embodiment where the photosintering system 101 includes multiple photosintering devices 102, as described above the factory embodiment, the multiple photosintering devices 102 can be triggered simultaneously or sequentially.

In some implementations, the triggering signal is generated by the photosintering system 108 when the system determines that the photosintering device 102 is positioned correctly. For example, the photosintering device 102 can automatically expose the sub-area once the device is correctly positioned.

In some implementations, the triggering signal can be manually generated by a user of the user device 104 or require user feedback through the application environment 110 of the photosintering application 108. For example, if the user of the user device 104 is operating in an "expert" or "manual control" mode of the photosintering system 101, the user may provide the triggering signal manually to the photosintering device 103 to expose the sub-area 132.

In some implementations, a base unit area is determined for the sintering area 107 with a particular set of dimensions 126, e.g., a base unit width and a base unit length. A region to be sintered, e.g., for a roll-to-roll process, can be larger than the base unit such that there are multiple sintering areas 107 that are processed by the photosintering system 101. In one example, a large area painted circuit with dimensions exceeding the base unit dimensions is processed by the photosintering system 101. The large area painted circuit is divided into two or more base units, where each base unit is sintered according to the sintering process defined in FIG. 3 above. The large area painted circuit may not evenly divide into base units and a partial base unit may be processed by the photosintering system 101 using the particular dimensions 126 of the partial base unit area.

In some implementations, the process described with reference to FIG. 3 is a sub-process of multiple other sub-processes for fabricating a paint circuit. As described below with reference to FIGS. 4 and 5, the photosintering process of FIG. 3 can be incorporated into a fabrication process to fabricate a painted circuit including the sintering process, e.g., for fabricating a painted solar cell.

In one embodiment, the system can operate in an "expert mode" or "debug" mode that allows a user of the user device 104 to manually control various aspects of the photosintering system, for example, triggering of the photosintering device 102, determining an exposure value for the fractional sintering energy, specify a layer structure for the sintering area 107, or the like. In one example, a user of the user device 104 can provide exposure data 138 to the sub-area exposure determiner 118. User-provided exposure data 138 can include exposure energy information, e.g., an amount of energy required to sinter the photosintering area, layer information for the sintering area 107, and the like.

Example Process for Producing Solar Paint Formulations

Solar paint circuits, including the solar paint circuit 500 discussed below with reference to FIG. 5, include multiple layers of solar paint. Solar paint can include various formulations selected to give the solar paint layers applied with the particular solar paint different electrical (e.g., resistive/conductive), reactive (e.g., photo-reactive), dielectric (e.g., voltage breakdown) and physical properties (e.g., viscosity). In some implementations, paint formulations are aqueous and include water, a solvent (e.g., ethanol), and/or an emulsifier.

In some implementations, paint formulations include nanoparticles (e.g., metallic or semiconductor nanoparticles) dispersed in a solution (e.g., ethanol, deionized water and surfactant).

Implementations of solar paints include conductive paint (e.g., for n-type electron conducting and p-type hole conducting paint layers). Conductive paint can be an aqueous composition including one or more conductive or semiconductor nanomaterials (e.g., metallic or semiconductor nanoparticles) dispersed in solution. Examples of suitable nanomaterials include aluminum-doped zinc oxide nanoparticles, copper oxide nanoparticles, and carbon-based nanomaterials (e.g., carbon nanotubes). Examples of suitable solution (e.g., deionized water with a dispersant (e.g., benzenesulfonic acid or sodium dodecyl sulfate) and denatured alcohol (e.g., denatured ethanol). In some implementations, conductive nanomaterials (e.g., nanoparticles) are selected based in part on a transparency of the resulting conductive paint including the conductive nanomaterials. Additionally, deflocculants (e.g., sodium lauryl dodecasulfide or a basic salt like sodium carbonate or potassium carbonate) can be added to the conductive paint including the conducting nanomaterials to prevent flocculation, minimize surface energy of the dispersed nanoparticles, and assist in dispersion of the nanomaterials and improve transparency.

In some implementations, the conductive paint is treated in an ultrasonic bath to break up aggregated nanomaterials and filtered (e.g., through a microfiber cloth) in order to fully disperse the nanomaterials in the conductive paint. In some implementations, the conductive paint may be dispersed using a ball mill treatment and/or high-shear mixing. In some implementations, a sol-gel process can be used for preparing and applying a conductive paint, e.g., a sol-gel process can be used for at least the outer transparent conductive layer.

Example Process for Producing Solar Paint Circuit

Figure 4:
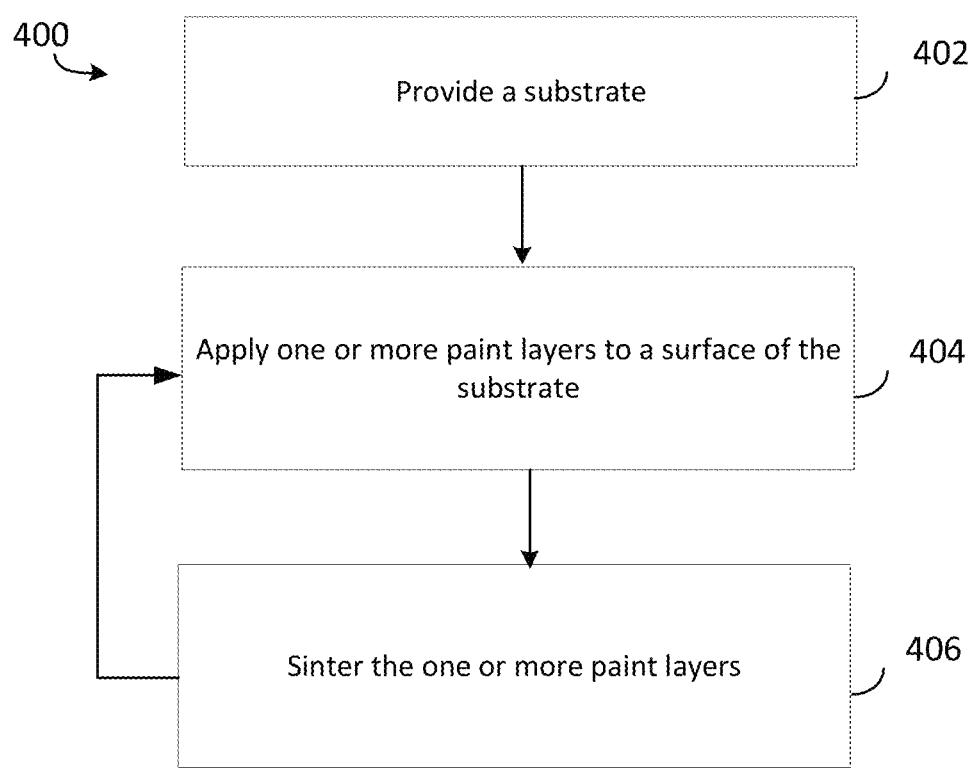
FIG. 4 is a flow diagram of an example process for painting a paint circuit.

FIG. 4 is a flow chart of an example process 400 for painting a solar paint circuit. In general, a solar paint circuit (e.g., solar paint circuit 500) can be fabricated according to process 400, as shown in the flow diagram in FIG. 4. In 402, a substrate is provided. Substrates can include metal, wood, plaster, fabric, or the like. A substrate can further include a wire mesh or foil affixed to a base structural material, to provide electrical conductivity. In 404, one or more paint layers are applied to a surface of the substrate, where each paint layer includes a conductive paint formulation. In some implementations, each applied paint layer is allowed to dry prior to the application of a subsequent layer. In some implementations, each applied paint layer may include a formulation having one or more solvents that are allowed to evaporate prior to the application of a subsequent layer.

A conductive paint layer applied using the conductive paint formulation has a resistance defined, in part, by the resistivity of the conductive material included in the conductive paint formulation. For example, a conductive paint layer applied using conductive paint formulation including a first conductive material (e.g., a conductive nanomaterial) having a higher resistivity provides a higher resistance than a conductive paint layer applied using a conductive paint formulation including a second different conductive material having a lower resistivity.

In some implementations, multiple coatings of a same conductive paint formulation can be applied to form a layer of a desired thickness, where the desired thickness is greater than a thickness of a single applied layer. Each coating of the same conductive paint may be allowed to dry prior to the application of a subsequent layer.

In some implementations, one or more dimensions of the substrate (e.g., aluminum foil) are selected to maximize charge mobility and/or for ease of manufacturing of the solar paint circuit (e.g., roll-to-roll processing). Paint layers may be applied to a roughened surface of the aluminum foil to improve adhesion of the paint to the substrate, maximize a number of charge carriers available at the substrate surface, and/or increase the surface area of the substrate in contact with the applied paint layers. In one example, a substrate is a long thin strip of aluminum foil.

In some implementations, one or more dimensions of the substrate (e.g., aluminum foil) are selected to optimize a cost-per-power-output for the solar paint circuit (e.g., solar cell) efficiency. Though the term "optimize" is used here in reference to a particular scenario where a cost-per-power output is minimized, other "optimized" scenarios may be possible depending on a desired outcome (e.g., low environmental impact, accessibility of materials, minimal manufacturing steps, etc.). Thus, the use of the terms "optimize," "optimal," or other similar terms as used herein do not refer to a single optimal outcome.

In one example of a solar cell design that is optimized for cost-per-power output and for a selected length of the solar cell (e.g., selected based on a manufacturing process or dimensions of an installation location), a width of the solar cell can be determined using the following procedure. In this example, it is assumed that a solar cell manufactured with these specifications is used in consistent ambient conditions (e.g., a regular amount of absorbable light energy and spectral distribution of the light energy). It is also assumed that a dominant source of shunt resistance is a transparent outer conductive layer (e.g., n-type electron conducting layer) of the solar cell, for example, that an electrode connecting the solar cell to an external circuit is highly conductive.

A width-independent photoconversion efficiency can be determined for a solar cell, where the solar cell includes an electrical contact with a top shunt electrode that is consistent along a length of the cell and located on one side of the solar cell, by covering the solar cell with an opaque barrier parallel to the top shunt electrode and measuring the power output per unit of expose surface area for the solar cell. Dividing the power output per unit of exposed surface area by an input energy ($I_{in}$) in units of power per surface area (e.g., watts per square meter) yields the solar cell efficiency. Width-independent photoconversion efficiencies (e) can be found for multiple solar cells each having different widths and a simple linear regression (e.g., $e_{total} = e_{wi} - we_{loss}$) can be used to determine the power loss per unit of width (w) such that a y-intercept of the linear regression is a width-independent photoconversion efficiency of the solar cell ($ew_i$).

For a selected length of solar cell (e.g., selected based on a manufacturing process or dimensions of an installation location), a known cost per unit area ($c_{area}$), and a known cost per unit area of the electrodes ($c_{electrode}$), a solar cell width to optimize the cost per power output ($C_{power}$) of the solar cell can be determined by a ratio of the solar cell cost ($C_{cell}$) to the solar cell power output ($I_{out}$).

$$C_{cell}(w) = wlc_{area} + lc_{electrode} \tag{1}$$

$$I_{out}(w) = I_{in}wle_{wi} - I_{in}we_{loss} \tag{2}$$

$$C_{power}(w) = \frac{C_{cell}(w)}{I_{out}(w)} \tag{3}$$

$$C_{power}(w) = \frac{wlc_{area} + lc_{electrode}}{I_{in}wle_{wi} - I_{in}we_{loss}} \tag{4}$$

The derivatives of $C_{cell}(w)$ and $I_{out}(w)$ can be found.

$$C_{cell}'(w) = lc_{area} \tag{5}$$

$$I_{out}'(w) = I_{in}e_{wi} - I_{in}e_{loss} \tag{6}$$

$C_{power}(w)$ can be solved algebraically for positive, real values of $C_{power}'(w)=0$, by substituting the known values of the constants to find the optimal solar cell width.

$$C_{power}'(w) = \frac{C_{cell}'(\omega)I_{out}(w) - C_{cell}(w)I_{out}'(w)}{I_{out}^2(w)} \tag{7}$$

$$C_{power}'(w) = \frac{(lc_{area})(I_{in}wle_{wi} - I_{in}we_{loss}) - (wlc_{area} + lc_{electrode})(I_{in}le_{wi} - I_{in}e_{loss})}{(I_{in}wle_{wi} - I_{in}we_{loss})^2} \tag{8}$$

In step 406, one or more of the painted layers are sintered. A sintering process may include heating the one or more paint layers using a photosintering system, e.g., photosintering system 101 and a process as described above with reference to FIG. 3 until the nanoparticles of the one or more paint layers agglomerate into an electrically continuous layer (e.g., as measured by a four-point probe or other resistance measurements), and/or a structurally continuous layer (e.g., as measured by ellipsometry or other optical inspection). Other sintering processes can include, for example, utilizing a furnace, a rapid thermal processing (RTP) system, or other heating source for a period of time. A range of combinations of sintering energies, temperatures, and/or durations for a sintering process may be appropriate to achieve an electrically continuous layer, and may depend in part on a type of sintering process (e.g., a tool or system) used. In some implementations, a selected photosintering energy and duration of the sintering process for the one or more layers depends on cost-considerations, equipment limitations, and/or design limitations (e.g., thermal budget) of other paint layers in the solar paint circuit.

In some implementations, the photosintering application 108 includes a step-by-step process through the application environment 110 for the user of the user device 104 to fabricate the solar paint circuit, e.g., solar paint circuit described below with reference to FIG. 5. The application environment can provide guidance to the user on how to paint each paint layer of the one or more paint layers onto the substrate, and how to sinter the one or more paint layers, according to a fabrication process for the particular painted circuit, e.g., using painted circuits database 136. For example, a step-by-step process can include instructions on how to arrange a substrate, e.g., conductive foil, how to clean and/or prepare the substrate, how to apply one or more paint layers, e.g., to form a bottom conducting layer, how to sinter the one or more paint layers using the photosintering system, etc., until the painted circuit is completed.

Example Solar Paint Circuit

FIG. 5 is a block diagram of an example solar paint circuit 500. The solar paint circuit 500 includes a substrate 502, a p-type hole conducting paint layer 504, a photosensitized paint layer 506, an n-type electron conducting paint layer 508, and a transparent protective paint layer 510. In some implementations, the solar paint circuit 500 is a solar cell. A solar cell is an electrical device that converts the energy of light (e.g., sunlight) into electricity. Photons (e.g., sunlight) are absorbed in the photosensitized paint layer 514, and charge generation of electrons and holes occurs. The generated charges are then separated and the electrons move towards the cathode and holes move towards the anode, respectively, to generate electricity.

The p-type hole conducting paint layer 504 can be created by applying a p-type hole conducting paint to at least a portion of the substrate 502 (e.g., a surface composed of wood, metal, plaster, stone, brick, or another paintable material). In some implementations, the p-type hole conducting paint layer 504 forms an anode for the solar paint circuit 500. The p-type hole conducting paint layer 504 can be formed by an aqueous paint composition including p-type nanomaterials dispersed in a solution. The p-type nanomaterials, e.g., nanoparticles, of the p-type hole conducting paint layer 504 can be sintered, e.g., using photosintering system 101, to form an electrically and/or physically continuous p-type hole conducting layer 504.

The photosensitized paint layer 506 forms a layer where photons can be absorbed and charge generation takes place in the solar paint circuit 500. The photosensitized paint layer 506 can be formed from paint compositions including an electron acceptor, a dye, and a solution. The photosensitized paint layer 506 is depicted as a single functional layer in solar paint circuit 500, however, it can be created by applying two or more different paint layers including a semiconductor paint layer having an electron acceptor material and a photosensitized dye paint layer.

The n-type electron conducting paint layer 508 is applied to the photosensitized paint layer 506. In some implementations, the n-type electron conducting paint layer 508 forms a cathode for solar paint circuit 500. The n-type electron conducting paint layer 508 can be formed by an aqueous paint composition including n-type nanomaterials dispersed in a solution. The n-type electron conducting paint layer 508 can be transparent or semi-transparent to allow light to reach the photosensitized paint layer 106 below. The n-type nanomaterials, e.g., nanoparticles, of the n-type electron conducting paint layer 508 can be sintered, e.g., using photosintering system 101, to form an electrically and/or physically continuous n-type electron conducting layer 508. In some implementations, rather than an n-type electron conducting paint layer 508, an electrically conductive mesh (e.g., a wire mesh) is used as a cathode layer for solar paint circuit 500.

A transparent protective paint layer 510 is applied to the n-type electron conducting layer 508. The transparent protective paint layer 510 can be a transparent protecting coating and can be electrically insulating (e.g., laminate, polyurethane finish, shellac). In some implementations, the transparent protective paint layer 510 encapsulates a portion or all of the exposed surfaces of the solar paint circuit 500. The transparent protective paint layer 510 forms a protective layer over part or all of the solar paint circuit 500 to protect the solar paint circuit 500 paint layers from environmental effects (e.g., UV radiation, weather, water/humidity). In some implementations, the transparent protective paint layer 510 is semi-transparent, and/or only transparent to certain wavelengths ranges (e.g., transparent to visible wavelengths). In some implementations, the transparent protective paint layer 510 is omitted, depending in part on application and/or environmental factors (e.g., level of exposure to weather). When the transparent protective paint layer 510 is omitted, the n-type electron conducting paint layer 508 can function as a conductive protective layer (e.g., indium tin oxide).

The solar paint circuit 500 operates to absorb photons from the ambient environment (e.g., solar rays) in the photosensitized paint layer 506, such that electron-hole pairs are formed within the photosensitized paint layer 506, and charge separation occurs between the p-type hole conducting paint layer 504 and the n-type electron conducting paint layer 508.

In some implementations, the separated charges from solar paint circuit 500 are then used to charge (e.g., trickle charge) a battery. The solar paint circuit 500 can be combined with other circuit elements to produce a solar-powered light (e.g., a solar-powered streetlight). For example, the solar paint circuit 500 may be combined with a solar battery and a light-emitting circuit, where the solar paint circuit 500 can be used to generate electricity from sunlight to charge (e.g., trickle charge) a solar battery, which can then be used to power a light-emitting circuit. The powered light-emitting circuit can then emit light in a particular range of wavelengths (e.g., visible light).

In some implementations, electrical contacts 512 can be included in the solar paint circuit 500. The electrical contacts can include a first contact (e.g., metallic foil, metallic mesh, cold weld bonding compound, solder ball, alligator clip, or the like) affixed to an n-type electron conducting paint layer 508 or to a substrate 502. A second contact (e.g., metallic foil, metallic mesh, cold weld bonding compound, solder ball, alligator clip, or the like) can be affixed to a p-type hole conducting paint layer 504. The electrical contacts can be used to connect to the solar paint circuit 500 to an external device (e.g., a mobile phone, computer, or other battery-operated device). The electrical contacts 512 can also be used to connect the solar paint circuit 500 to other solar circuits, for example, to daisy-chain a set of solar cell painted circuits, to increase throughput for powering and/or charging a user device (e.g., a cell phone or computer), or charging a solar battery.

While this specification contains many specific implementation details, these should not be construed as limitations on the scope of any features or of what can be claimed, but rather as descriptions of features specific to particular embodiments of the described painted circuits and painted circuit elements. Though the painted circuits and painted circuit elements examples are described herein as having particular layer structures, they should not be read as limiting. For example, the painted circuits and painted circuit elements are described as operating in a "top-down" fashion where the devices are painted layer-by-layer such that the top layer is the top of the device. While processes are depicted in the drawings in a particular order, this should not be understood as requiring that such processes be performed in the particular order shown or in sequential order, or that all illustrated processes be performed, to achieve desirable results. For example, the painted circuits and painted circuit elements may also be painted in a "bottom-up" fashion where the function of the devices is upside relative to their fabrication order. Additionally, "flip-chip" configurations can be imagined where two substrates are individually painted with paint layers and then combined.

Other complex painted circuit elements can be created using the techniques and compositions described herein. For example, painted antenna elements. Additionally, active matrices of multiple smaller sub-elements (e.g., embedded painted circuit elements) can be created using the techniques and compositions described herein.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:
1. A photosintering system comprising:
  a photosintering device including a light source and a plurality of proximity sensors; and
  a mobile device comprising:
    a camera;
    a data communication link; and one or more processors in data communication with the photosintering device over the data communication link, and operable to perform the operations comprising:

obtaining, by one or more processors and using the camera, an image of a sintering area;

generating, by the one or more processors and using the image of the sintering area, a grid of the sintering area including a plurality of sub-areas to be sintered within the sintering area, each sub-area defined by a length and a width, and a respective position within the sintering area; and for each particular sub-area of the plurality of sub-areas:
  determining a respective fractional sintering energy for the particular sub-area;
  indicating how to position a photosintering device relative to the particular sub-area;
  obtaining, using the plurality of proximity sensors and the camera, current positional information for the photosintering device;
  determining that the current positional information indicates that the photosintering device is positioned relative to the particular sub-area in accordance with the indication of how to position the photosintering device;
  determining, for the sub-area, a cumulative amount of sintering energy applied to the sub-area by previous exposures using the light source of the photosintering device to one or more other sub-areas of the plurality of sub-areas;
  determining an exposure sintering energy to apply to the particular sub-area using a difference between the fractional sintering energy for the particular sub-area and the determined cumulative amount of sintering energy previously exposed to the particular sub-area; and
  triggering exposure of the exposure sintering energy by the light source of the photosintering device and to the particular sub-area in accordance with the indication of how to position the photosintering device.

2. The system of claim 1, wherein the light source is a flash lamp.

3. The system of claim 1, wherein indicating how to position the photosintering device relative to the particular sub-area comprises presenting positional information on a display of the mobile device.

4. The system of claim 1, wherein obtaining the image of the sintering area comprises capturing the image of the sintering area with the camera of the mobile device.

5. The system of claim 4, wherein obtaining the current positional information comprises receiving, from the camera of the mobile device, one or more images of the sintering area.

6. The system of claim 5, wherein obtaining the image of the sintering area comprises obtaining one or more images of one or more painted layers on a substrate.

7. The system of claim 1, further comprising an automated device that controls a relative position of the photosintering device relative to the particular sub-area to alter an orientation of the photosintering device relative to the particular sub-area, wherein indicating how to position the photosintering device relative to the particular sub-area comprises transmitting instructions to the automated device.

* * * * *

UNITED STATES PATENT AND TRADEMARK OFFICE
CERTIFICATE OF CORRECTION

| | | |
|---|---|---|
| PATENT NO. | : 11,935,983 B2 | Page 1 of 1 |
| APPLICATION NO. | : 16/664262 | |
| DATED | : March 19, 2024 | |
| INVENTOR(S) | : Bieneman et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 798 days.

Signed and Sealed this
Twelfth Day of August, 2025

Coke Morgan Stewart
*Acting Director of the United States Patent and Trademark Office*